(12) United States Patent
Yasukawa

(10) Patent No.: US 7,768,090 B2
(45) Date of Patent: Aug. 3, 2010

(54) SEMICONDUCTOR PHOTODETECTOR DEVICE

(75) Inventor: Hisatada Yasukawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/968,357

(22) Filed: Jan. 2, 2008

(65) Prior Publication Data

US 2008/0230817 A1    Sep. 25, 2008

(30) Foreign Application Priority Data

Mar. 20, 2007    (JP) .............................. 2007-072000

(51) Int. Cl.
*H01L 31/062* (2006.01)
(52) U.S. Cl. ..................... 257/446; 257/428; 257/292; 257/462; 257/E31.032
(58) Field of Classification Search ................. 257/462, 257/428, 438, 292, 446, E31.032
See application file for complete search history.

(56) References Cited

U.S. PATENT DOCUMENTS

| 6,580,109 | B1 * | 6/2003 | Thomas et al. .............. 257/292 |
| 2005/0167709 | A1 * | 8/2005 | Augusto ..................... 257/292 |
| 2005/0189546 | A1 * | 9/2005 | Yasukawa et al. ............. 257/79 |
| 2006/0290659 | A1 * | 12/2006 | Sakano et al. ................ 345/156 |

FOREIGN PATENT DOCUMENTS

| JP | 09-265652 | 10/1997 |
| JP | 11-045988 | 2/1999 |
| JP | 2000-252507 | 9/2000 |
| JP | 2006-120984 | 5/2006 |

* cited by examiner

*Primary Examiner*—A. Sefer
*Assistant Examiner*—Allen L Parker
(74) *Attorney, Agent, or Firm*—McDermott Will & Emery LLP

(57) ABSTRACT

A semiconductor photodetector device includes a light receiving operation section converting incident light to an electric signal and a current amplifying operation section amplifying the electric signal. The light receiving operation section includes: a first conductivity type semiconductor layer a formed on a first conductivity type semiconductor substrate; a second conductivity type first semiconductor region formed on the semiconductor layer; and a first conductivity type second semiconductor region formed on the semiconductor layer and separated from the first semiconductor region. The current amplifying operation section includes: the second semiconductor region; a second conductivity type third semiconductor region formed in the semiconductor substrate; a second conductivity type fourth semiconductor region formed on the third semiconductor region and separated from the second semiconductor region.

15 Claims, 6 Drawing Sheets

SEMICONDUCTOR PHOTODETECTOR DEVICE

BACKGROUND OF THE INVENTION

1. Field of the Invention

The present invention relates to semiconductor photodetector devices and particularly relates to a semiconductor photodetector device including a light receiving element and a logic element which are formed on a single substrate.

2. Background Art

Semiconductor photodetector devices include an optoelectronic integrated circuit (OEIC) device including a light receiving element converting a light signal to an electric signal, such as a photodiode or the like, an active element constituting a peripheral circuit, such as a transistor element or the like, and a passive element, such as a resistor, a capacitor, or the like which are all formed on a single substrate. Such the devices, which have a function of converting a light signal to an electric signal, have been used in various kinds of optical sensor devices and optical pickup devices for optical discs.

In the OEIC devices used as optical pickup devices, higher light sensibility and enhancement of operating speed are demanded. Further, BDs (Blue Digital Versatile Discs) using blue laser light was developed recently in addition to development of CDs (Compact Discs) using infrared laser light and DVDs (digital Versatile Discs) using red laser light, and therefore, a single optical pickup device is demanded which can detect three types of light source signals different in wavelength from one another. In short, an optical pickup device is demanded which exhibits excellent light sensitivity and high-speed responsiveness with respect to the blue laser light in addition while maintaining high light sensitivity and high-speed responsiveness with respect to each of the infrared laser light and the red laser light, which have been exhibited conventionally.

As a conventional example, an OEIC device will be described in which a photodiode element and a bipolar transistor element are formed monolithically (see Japanese Patent Application Laid-open unexamined Publication No. 2006-120984, for example).

FIG. 6 is a sectional view showing a conventional semiconductor photodetector device. As shown in the drawing, in the conventional semiconductor photodetector device, a P$^+$-type semiconductor layer 102 made of semiconductor containing an impurity at a high concentration is formed on a semiconductor substrate 101 of P-type silicon (Si) having a resistance ratio of 150 Ωcm and containing an impurity at a low concentration, and a P$^-$-type semiconductor layer 103 having an impurity concentration lower than that of the P$^+$-type semiconductor layer 102 is formed on the P$^+$-type semiconductor layer 102. On the P$^-$-type semiconductor layer 103, an N-type semiconductor layer 104 having an impurity concentration higher than that of the P$^-$-type semiconductor layer 103 is formed.

The peak point of the impurity concentration in the P$^+$-semiconductor layer 102 is set at a depth of approximately 10 μm from the upper surface of the N-type semiconductor layer 104. The thickness of the N-type semiconductor layer 104 is set at 2 μm for forming VPNP-Tr.

In the P$^-$-type semiconductor layer 103 and the N-type semiconductor layer 104, there are formed a light receiving element region 100, a first transistor region 200, and a second transistor region 220. An N$^+$-type semiconductor region 106 of which impurity concentration is higher than that of the N-type semiconductor layer 104 is formed in the uppermost part of the N-type semiconductor layer 104 in the light receiving element region 100. The thickness of the N$^+$-type semiconductor region 106 is equal to or smaller than 0.15 μm.

The cathode of the light receiving element region 100 is composed of a cathode contact region 107, an N-type polycrystalline semiconductor layer 108a, and a cathode electrode 109, which are formed in the vicinity of the N$^+$-type semiconductor region 106. The anode of the light receiving element region 100 is composed of a P$^+$-type buried region 110, an anode contact region 111, a P-type polycrystalline semiconductor layer 112, and an anode electrode 113, which are formed in the vicinity of the light receiving element region 100.

In contrast, the first transistor region 200, in which an NPN bipolar transistor is formed, is formed in the N-type semiconductor layer 104 and separated from the light receiving element region 100 and the second transistor region 220 by an isolation insulating layer 105 and the P$^+$-type buried region 110. The collector of the first transistor region 200 is composed of a buried collector region 114, a collector contact region 115, an N-type polycrystalline semiconductor layer 108b, and a collector electrode 116. The base thereof is composed of an active base region 117, a contact base region 118, a P-type polycrystalline semiconductor layer 112, and a base electrode 120. The emitter thereof is composed of an emitter region 119, an N-type polycrystalline semiconductor layer 108c, and an emitter electrode 121.

In the second transistor region 220, in which VPNP-Tr is formed, an N-type buried layer 130 is formed in the P$^-$-type semiconductor layer 103, and a P-type buried collector region 131 is formed in the N-type semiconductor layer 104 on the P$^-$-type semiconductor layer 103. The thickness of the N-type semiconductor layer 104 is set at approximately 2 μm for securing the P-type buried collector region 131.

The collector of the second transistor region 220 is composed of a P-type buried collector region 131, a collector contact region 132, an N-type polycrystalline semiconductor layer 108d, and a collector electrode 133. The base thereof is composed of an active base region 134, a contact base region 135, the P-type polycrystalline semiconductor layer 112, and a base electrode 136. The emitter thereof is composed of an emitter region 137, an N-type polycrystalline semiconductor layer 108e, and an emitter electrode 138. As described above, the structure shown in FIG. 6 enables formation of VPNP-Tr in the second transistor region 220.

The operation of the light receiving element region 100 of the thus structured conventional semiconductor device will be described with reference to FIG. 7A and FIG. 7B. FIG. 7A is a graph showing the impurity concentration distribution in the vertical direction of the conventional semiconductor photodetector shown in FIG. 6, and FIG. 7B is a graph showing the energy band in the vertical direction of the conventional semiconductor photodetector.

Laser light incident in the light receiving element region 100 is first irradiate at the surface of the N$^+$-type semiconductor region 106. As shown in FIG. 7A and FIG. 7B, carrier generated in the N$^+$-type semiconductor region 106 and the N-type semiconductor layer 104 is accelerated in the presence of the potential gradient a formed due to concentration difference between the N-type semiconductor layer 104 and the N$^+$-type semiconductor region 106 and moves due to impurity diffusion to the flat region d of the N-type semiconductor layer 104 from the N$^+$-type semiconductor region 106. The moving carrier reaches the P$^-$-type semiconductor layer 103. Since the cathode electrode 109 of the light receiving element region 100 receives reverse bias voltage in advance, there is formed in the P$^-$-type semiconductor layer 103 a depletion layer ranging from the P$^-$-type semiconductor layer 103 surrounded by the P⁺-type buried region 110 located around the light receiving element region 100 to the P⁺-type semiconductor layer 102. Accordingly, the carrier reaching the P⁻-type semiconductor layer 103 moves at high speed as drift current in the depletion layer to attain high-speed responsiveness of the light receiving element region 100.

Further, the incident light reaching the semiconductor substrate 101 generates carriers in the semiconductor substrate 101, and the thus generated carriers move in an arbitrary direction by diffusion. The traveling speed of the carriers, which depends on the diffusion, is low, and part of the carriers recombine to disappear. Though the remaining carriers not disappearing by recombination reach the vicinity of the P⁺-type semiconductor layer 102, the electrons of the carriers cannot reach the P⁺-type semiconductor layer 102 and the P⁻-type semiconductor layer 103 in the presence of the potential barrier created due to the presence of difference in impurity concentration between the P⁺-type semiconductor layer 102 and the semiconductor substrate 101 to be recombined and disappear. Accordingly, diffusion permits the moving carriers to disappear to thus attain further high-speed responsiveness.

SUMMARY OF THE INVENTION

As described above, there are three types in total of optical pickup devices, namely, devices using the infrared laser light for CDs, using the red laser light for DVDs, and using the blue laser light for high-density DVDs. For the high-density DVDs, which have large data density, the optical pickup devices are desired to exhibit high-speed responsiveness in addition to sufficient light sensitivity with respect to the blue laser light. Description will be given here about each amount of absorbed lights with the light wavelengths of the three types. The amount of light absorbed to semiconductor depends on the wavelength of incident light, and an amount of absorbed incident light having an absorption coefficient α of a specific wavelength at a part of semiconductor which is located at a depth t from the incident face is expressed by $1-e^{-\alpha t}$, wherein e is a base of natural logarithm. For example, the depth from the incident face where an amount of light absorbed in silicon semiconductor is approximately 90% is approximately 24 μm when the light is infrared laser light having a wavelength of 780 nm, approximately 7.7 μm when the light is red laser light having a wavelength of 650 nm, and approximately 0.6 μm when the light is blue laser light having a wavelength of 405 nm. Referring to photo-detection characteristics, if electron-hole pairs are efficiently generated correspondingly to the number of photons depending on the wavelength of light and the electrons or the holes are highly efficiently taken out electrically as a carrier contributing to current, the light sensitivity and the response speed are enhanced.

In the conventional example, however, the thickness of the N-type semiconductor layer 104 is required to be 2 μm at the smallest, and therefore, a flat region d where the potential gradient to the electron is flat is dominant. This extends the travel distance of the carriers moving in the flat region d to elongate time required until the carriers reach the generated depletion layer ranging from the P⁻-type semiconductor layer 103 to the N-type semiconductor layer 104. As a result, the response speed lowers. Longer travel distance of the carriers increases the amount of recombination as well to lower the light sensitivity.

The amount of the foregoing blue laser light absorbed is 90% at a dept of 0.6 μm, and accordingly, the carriers are generated in the non-depletion region in the surface portion to cause the influence of the above phenomenon to be significant, thereby lowering the response speed and the light sensitivity. In the conventional structure, the thicker the N-type semiconductor layer 104, the more the light sensitivity increases while the more the transistor characteristics lower. Namely, in formation of the light receiving element and the transistor, especially, VPNP-Tr, the light sensitivity and the thickness of the N-type semiconductor layer 104 where the transistor is formed fall in a tradeoff relationship, and therefore, it is difficult to satisfy both the characteristics.

Further, as shown in FIG. 6, in the P⁻-type semiconductor layer 103 provided in the semiconductor photodetector device of the conventional example, a high-resistance region is present between the P⁺-type buried region 110 and the P⁺-type semiconductor layer 102 to cause degradation of frequency characteristics in the light receiving element region 100. In the conventional example, the P⁺-type buried region 110 is patterned comparatively wide in order to lower this series resistance. This increases, however, the area of the peripheral region of the light receiving element region 100 to attain no reduction in chip area.

Further, the blue laser light, of which wavelength is shorter than those of the red laser light and the infrared laser light, has large energy per one photon and has less number of photons at the same light output amount. Accordingly, fewer carriers are generated to lower the light sensitivity. When supposing that the quantum efficiency is 100% (one electron-hole pair is generated for one photon), the light sensitivities are 0.63 A/W with respect to the infrared laser light, 0.52 A/W with respect to the red laser light, and 0.33 A/W with respect to the blue laser light. Therefore, it is necessary to increase the gain resistance of the OEIC circuit for the blue laser light more than the circuits for the other wavelength lights, which invites lowering of circuit frequency characteristics. With such low light sensitivity, noise characteristics are inferior when used as the OIEC.

The present invention has its objects of providing a semiconductor photodetector device having a light receiving element of which operation characteristics (light sensitivity and responsiveness) is enhanced and in which NPN transistor, a VPNP transistor, or the like can be incorporated easily.

To attain the above objects, a semiconductor photodetector device of the present invention includes: a light receiving element region including: a light receiving operation section converting incident light to an electric signal and including: a semiconductor layer of a first conductivity type formed on a first conductivity type semiconductor substrate; a first semiconductor region of a second conductivity type formed on the semiconductor layer; a second semiconductor region of the first conductivity type formed on the semiconductor layer; and a first isolation insulating layer separating the first semiconductor region from the second semiconductor region; and a current amplifying operation section amplifying the electric signal and including: the second semiconductor region; a third semiconductor region of the second conductivity type formed in the semiconductor substrate; a fourth semiconductor region of the second conductivity type formed on the third semiconductor region; and a second isolation insulating layer separating the second semiconductor region from the fourth semiconductor region.

With the above arrangement in which the light receiving operation section generating the photoelectric current and the current amplifying operation section are formed on the semiconductor substrate, the signal converted from the incident light can be amplified sufficiently.

Particularly, application of high voltage between the third semiconductor region and the second semiconductor region allows the current amplifying operation section to amplify the signal with the avalanche amplification utilized. This attains enhancement of the light sensitivity and high-frequency characteristics and attains high-speed responsiveness without increasing the thickness of the second conductivity type first semiconductor region. Further, the light sensitivity with respect to the blue laser light can be enhanced in addition to enhancement of the light sensitivities with respect to the infrared laser light and the red laser light. Only either the electrons and the holes can be amplified, thereby reducing noise. The semiconductor regions composing the light receiving element region can be formed in the same steps as transistor forming steps to achieve easy integration of the light receiving element region and various kinds of transistors on a single substrate.

In addition, the light sensitivity of the light receiving element region can be increased sufficiently, thereby relaxing restriction for ensuring the characteristics of the light receiving element region on the structure of the various transistors provided on a single substrate.

DESCRIPTION OF THE PREFERRED EMBODIMENTS

Embodiment 1

Figure 1:
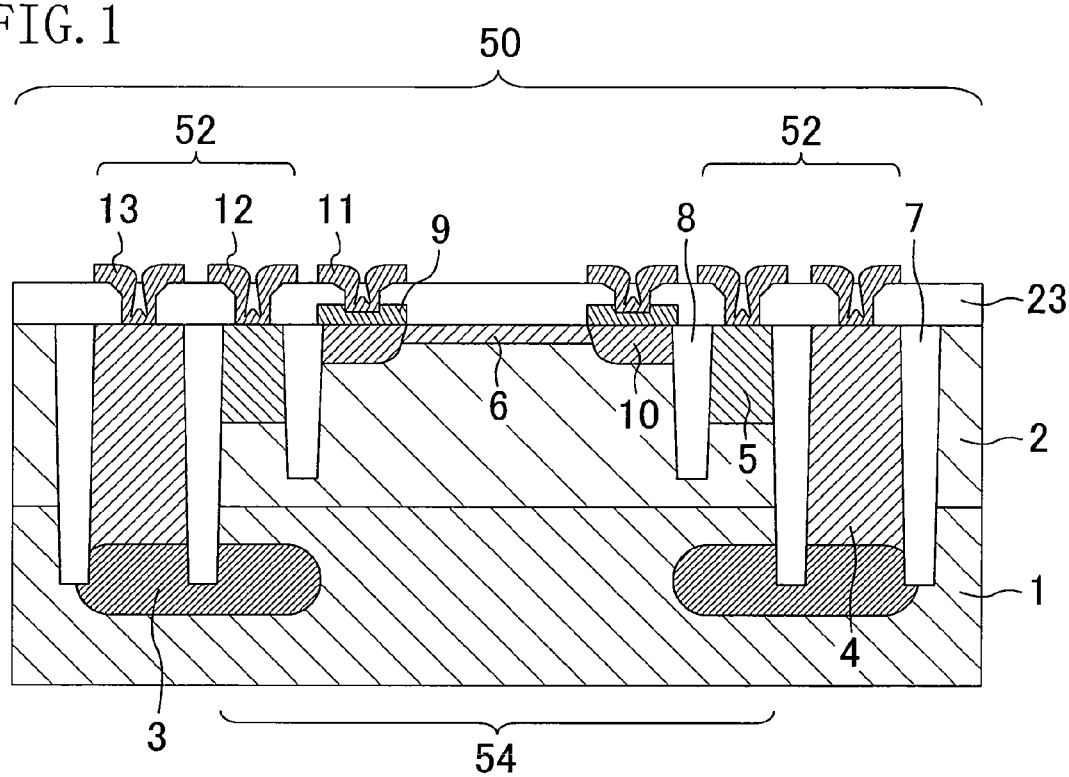
FIG. 1 is a sectional view showing a light receiving element region of a semiconductor photodetector device in accordance with Embodiment 1 of the present invention.

Embodiment 1 of the present invention will be described with reference to the accompanying drawings. FIG. 1 is a sectional view showing a light receiving element region of a semiconductor photodetector device in accordance with Embodiment 1 of the present invention. The light receiving element region 50 of the present embodiment includes a light receiving operation section 54 that converts incident light to an electric signal and a current amplifying operation section 52 that amplifies the signal generated in the light receiving operation section 54 by, for example, avalanche amplification. An anode electrode 12 and a P$^+$-type semiconductor region 5 belong to both the light receiving operation section 54 and the current amplifying operation section 52.

Figure 4:
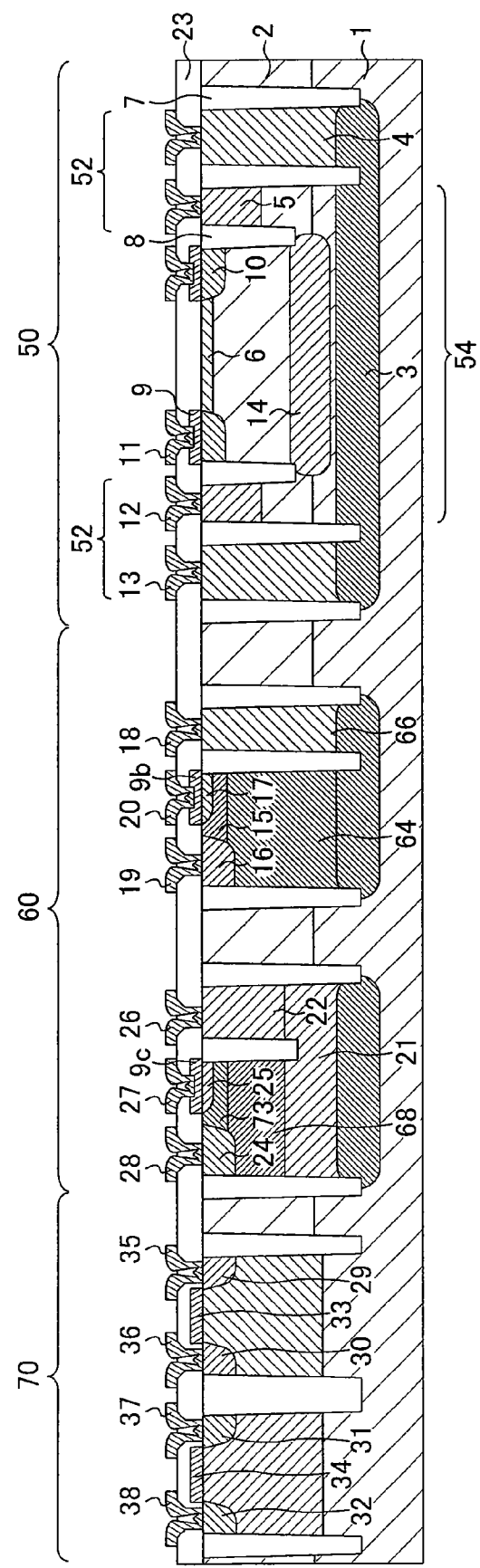
FIG. 4 is a sectional view showing a semiconductor photodetector device (an OEIC device) in accordance with Embodiment 4 of the present invention.

As shown in FIGS. 1 and 4, in a p$^-$-type semiconductor substrate 1, for example, made of P-type silicon (Si) at a low impurity concentration having a resistance ratio of about 100 Ωcm to 200 Ωcm, an N$^+$-type semiconductor region 3 formed of a semiconductor layer having a thickness of 2 μm and an high impurity concentration of approximately $1\times10^{18}$ cm$^{-3}$ is formed by selective ion implantation. The N$^+$-type semiconductor region 3 is located within the P$^-$-type semiconductor substrate 1 in the current amplifying operation section 52. On the P$^-$-type semiconductor substrate 1, a P$^-$-type semiconductor layer 2 is epitaxially grown which has a thickness of 2 μm and an impurity concentration higher than the P$^-$-type semiconductor substrate 1, for example, approximately $1\times10^{16}$ cm$^{-3}$.

The principal face (the face where circuits are formed) of the thus formed epitaxial substrate is divided into the light receiving element region 50, a first transistor region 60, and a second transistor region 70 (see FIG. 4). The light receiving element region 50, the first transistor region 60, and the second transistor region 70 are defined by isolation insulating layer 7 made of silicon oxide (SiO$_2$) locally subjected to trench processing. The isolation insulating layer 7 is formed deeper than the P$^-$-type semiconductor layer 2 at a part between the anode electrode 12 and the cathode electrode 13 and at the boundary with the first transistor region 60. An isolation insulating layer 8 formed between the cathode electrode 11 and the anode electrode 12 is formed shallower than the P$^-$-type semiconductor layer 2 (namely, the bottom face of the isolation insulating layer 8 is located at a part shallower than the bottom face of the P$^-$-type semiconductor layer 2). On the region of the P$^-$-type semiconductor layer 2 except each electrode, a protection insulating film 23 made of, for example, silicon oxide or the like is formed as a passivation film.

Referring to the most significant feature of the present embodiment, an N$^+$-type semiconductor region 6 is formed selectively in the upper part of the P$^-$-type semiconductor layer 2 in the light receiving operation section 54, wherein the N$^+$-type semiconductor region 6 has a thickness of 0.2 μm, an impurity peak point at a depth of 0.1 μm from the upper surface of the P$^-$-type semiconductor layer 2, and an impurity concentration of approximately $1\times10^{18}$ cm$^{-3}$, for example. The N$^+$-type semiconductor region 6 may be formed on the P$^-$-type semiconductor layer 2. A polycrystalline semiconductor layer 9 to which an N-type impurity is introduced at a high concentration is selectively formed on the side of the N$^+$-type semiconductor region 6 so as to diffuse the impurity downward, thereby forming a cathode contact layer 10. The cathode electrode 11 is formed on the polycrystalline semiconductor layer 9.

In the vicinity of the isolation insulating layer 7, a P$^+$-type semiconductor region 5 is selectively formed by ion implantation which has an impurity peak point at a depth of 0.2 μm from the upper surface of the P$^-$-type semiconductor layer 2, a thickness of 0.4 μm, and an impurity concentration of approximately $1\times10^{18}$ cm$^{-3}$, for example. The anode electrode 12 is formed on the P$^+$-type semiconductor region 5.

An N$^+$-type semiconductor region 4 surrounded by the isolation insulating layer 7 is formed outside the P$^+$-type semiconductor region 5 in the light receiving element region 50 so as to be in contact with the N$^+$-type semiconductor region 3. The cathode electrode 13 for avalanche amplification is formed on the N$^+$-type semiconductor region 4. The cathode electrodes 11, 13 and the anode electrode 12 are in ring shapes. The semiconductor region 5 is formed so as to surround the N$^+$-type semiconductor region 6 and the cathode contact layer 10 with the isolation insulating layer 8 interposed, and the N⁺-type semiconductor region 4 is formed so as to surround the P⁺-type semiconductor region 5 with the isolation insulating layer 7 interposed. This arrangement is a layout design in which the field concentration in operation is relaxed and the vertical field distribution is dominant.

Formation of the diffusion layer 10 and the isolation layer 8 as above attains the light receiving element region 50 in which the light receiving operation section 54 and the current amplifying operation section 52 are arranged side by side. It is the significant difference from the conventional semiconductor photodetector device that the light receiving operation section 54 and the current amplifying operation section 52 are provided side by side and the pn junction for forming the depletion layer in the light receiving operation section 54 is formed in the P⁻-type semiconductor layer 2 and the N⁺-type semiconductor region 6.

Figure 5A:
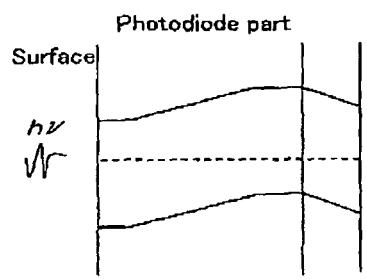
FIG. 5A shows potential distributions in a conventional semiconductor photodetector device.
Figure 5A:
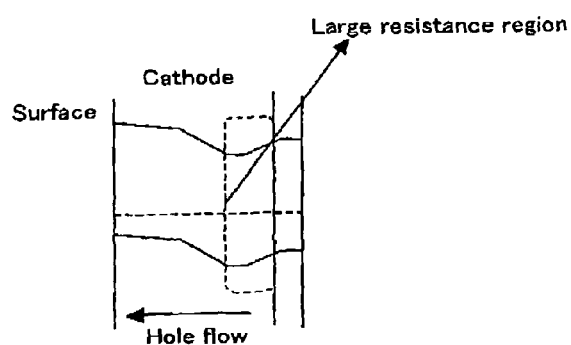
Figure 5B:
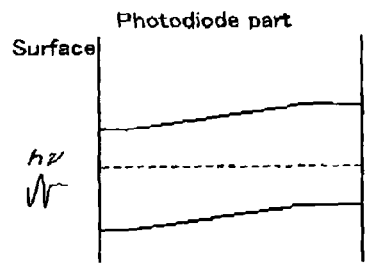
FIG. 5B to FIG. 5D show potential distributions in the light receiving element regions of the semiconductor photodetector devices in accordance with Embodiments 1 to 3.
Figure 5B:
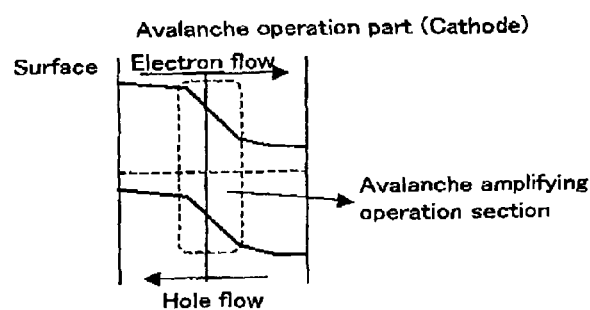

The principle of amplification by the light receiving element 50 of the present embodiment will be described below. FIG. 5B presents graphs showing potential distributions of the light receiving operation section 54 (a photodiode part) and the current amplifying operation section 52 (an avalanche operation part) of the light receiving element region 50.

Laser light is irradiated to the photodiode of the light receiving operation section 54 first to generate electron-hole pairs in the depletion layer of the light receiving region. Along the potential gradient in the depletion layer shown in the left graph of FIG. 5B, the electrons and the holes move toward the N⁺-type semiconductor region 6 and the P⁻-type semiconductor substrate 1, respectively, according to the electric field. The electrons are absorbed to the cathode electrode 11 directly. On the other hand, the holes move toward the P⁻-type semiconductor substrate 1 and then move toward the P⁺-type semiconductor region 5 in the presence of the inner potential difference generated in the P⁺-type semiconductor region 5. Under this state, when voltage around the avalanche breakdown between the P⁺-type semiconductor region 5 and the N⁺-type semiconductor region 3 is applied to the N⁺-type semiconductor region 3 through the N⁺-type semiconductor region 4, parts of the P⁻-type semiconductor layer 2, the P⁻-type semiconductor substrate 1, and the N⁺-type semiconductor region 3, which are located below the P⁺-type semiconductor region 5 form a sharp potential gradient shown in the right graph in FIG. 5B to cause the holes to move in a high electric field, thereby generating additional electron-hole pairs by the avalanche operation. Repetition of this phenomenon generates electron-hole pairs more than the electron-hole pairs generated by laser light to thus cause current amplification. This current amplification attains light sensitivity higher the aforementioned light sensitivity depending on the wavelength of the laser light at 100% quantum efficiency. Accordingly, even in the case where the photoelectric current generated in the light receiving operation region 54 is reduced for improving the transistor characteristics by setting the P⁻-type semiconductor layer 2 thin, the light sensitivity can be set high by the amplification, thereby relaxing the aforementioned tradeoff relationship. In order to amplify the avalanche, comparatively high voltage, for example, approximately 15 V must be applied between the cathode electrode 13 and the anode electrode 12. It is noted that FIG. 5A presents graphs showing potential distributions in the conventional semiconductor photodetector device shown for comparison.

In the light receiving element region 50 of the present embodiment, the electrons and the holes generated in the depletion layer flow toward the cathode electrode 11 and the anode electrode 12, respectively. Accordingly, only the holes serve as a trigger for avalanche amplification, which leads to remarkable improvement on noise characteristics.

In a semiconductor photodetector device including the light receiving element region 50 of the present embodiment, the P⁻-type semiconductor layer is permitted to be thin to enhance the light sensitivity with respect to not only the red laser light and the infrared laser light but also the blue laser light that causes electron-hole pairs to be generated in a shallow region of the P⁻-type semiconductor layer 2. This enables the single light receiving element region 50 to convert laser lights having wavelengths different from one another to signals without providing plural light receiving elements for the respective color lights. An antireflection film (not shown) is formed on the photodiode (on the N⁺-type semiconductor region 6). If the antireflection film is set for blue laser light, the amount of the blue laser light incident to the light receiving operation section 54 can be prevented from being dampened preferably.

The concentrations of the impurities contained in the semiconductors layer and the semiconductor regions composing the light receiving element region 50 are not limited to the above indicated values. Nevertheless, in order to form the depletion layer during operation, the concentration of the impurity contained in the P⁻-type semiconductor layer 2 is preferably equal to or higher than that in the P⁻-type semiconductor substrate 1 and lower than that in the N⁺-type semiconductor region 6. Further, in order to reduce the resistance in the current amplifying operation section, 52 the concentration of the impurity contained in the N⁺-type semiconductor region 3 is preferably higher than that in the P⁻-type semiconductor substrate 1, and the concentration of the impurity contained in the N⁺-type semiconductor region 4 is preferably higher than that in the N⁺-type semiconductor region 3. In addition, in order to reduce the contact resistance with the anode electrode 12, the concentration of the impurity contained in the P⁺-type semiconductor region 5 is preferably higher than that in the P⁻-type semiconductor substrate 1.

It is noted that the operation can be performed even if the conductivity types of the impurities contained in the respective parts of the light receiving element region 50 are reversed in the present embodiment. This enables design in which only the electrons of the electron-hole pairs generated in the light receiving operation section 54 cause avalanche amplification.

Though silicon is the most preferably used as a material of the P⁻-type semiconductor substrate 1, another semiconductor may be used, such as SiGe, a compound semiconductor, or the like.

The light receiving element region 50 of the present embodiment is formed by a known manufacturing technique. Specifically: the N⁺-type semiconductor region 3 is formed by implanting an N-type impurity ion into the P⁻-type semiconductor substrate 1; the P⁻-type semiconductor layer 2 having a thickness of approximately 2 μm is epitaxially grown on the P⁻-type semiconductor substrate 1 by CVD or the like; ion implantation is performed to form the P⁺-type semiconductor region 5, the N⁺-type semiconductor region 4, and the N⁺-type semiconductor region 6 sequentially; the isolation insulating layers 7, 8 are formed by a known STI forming technique; the polycrystalline semiconductor layer 9 made of polysilicon containing an N-type impurity at a high concentration and having a thickness of approximately 0.2 μm is formed on a part of the P⁻-type semiconductor layer 2; the cathode contact layer 10 containing the N-type impurity is formed in such a manner that thermal treatment is performed to diffuse the impurity from the polycrystalline semiconductor layer 9 toward the P⁻-type semiconductor layer 2; then each electrode is formed and the protection insulating film 23 is formed. Through the above steps, the light receiving element region 50 of the present embodiment is formed.

Embodiment 2

Figure 2:
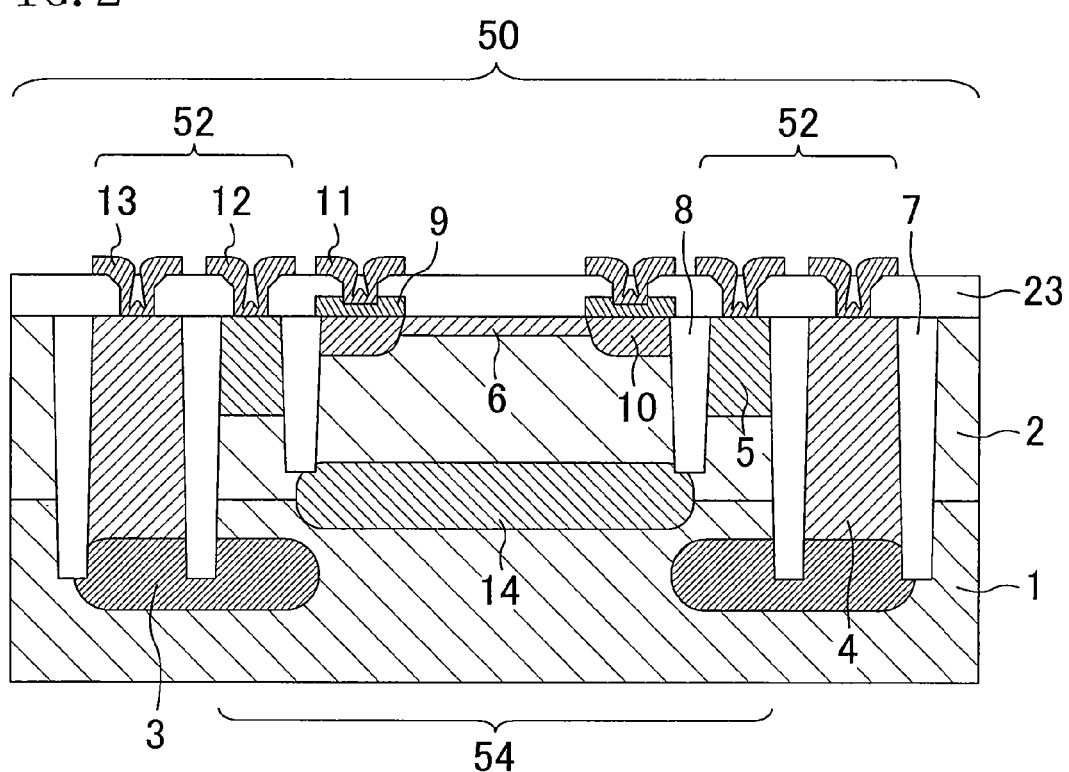
FIG. 2 is a sectional view showing a light receiving element region of a semiconductor photodetector device in accordance with Embodiment 2 of the present invention.

FIG. 2 is a sectional view showing a light receiving element region of a semiconductor photodetector device in accordance with Embodiment 2 of the present invention. The light receiving element region 50 in the present embodiment is a light receiving element region of Embodiment 1 to which a P$^+$-type semiconductor region 14 is added between the P$^-$-type semiconductor substrate 1 and the P$^-$-type semiconductor layer 2 in the light receiving operation section 54.

Figure 5C:
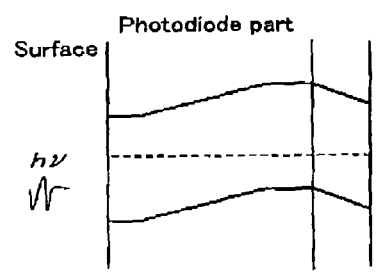
Figure 5C:
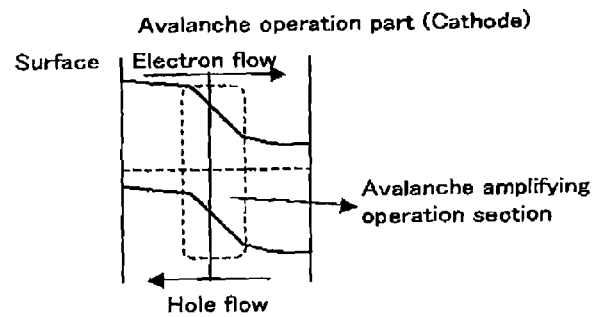

In the semiconductor photodetector device in accordance with Embodiment 1 shown in FIG. 1, the depletion layer in the light receiving operation section 54 reaches the P$^-$-type semiconductor substrate 1, so that the carrier generated from a longer wavelength laser light contributes as the photoelectric current even in the P$^-$-type semiconductor substrate 1, which may cause large variation in amount of the photoelectric current. In contrast, in the semiconductor photodetector device in accordance with the present embodiment, formation of the P$^+$-type semiconductor region 14 enables generation of high internal electric filed having high potential in the P$^-$-type semiconductor substrate 1, as shown in FIG. 5C. This allows the P$^+$-type semiconductor region 14 to serve as a non-depletion layer region, so that the carriers in this region move by diffusion dominantly. Accordingly, almost all of the carriers generated in the P$^-$-type semiconductor substrate 1 are recombined, and therefore, no carrier flows into the light receiving operation section 54, thereby obtaining stable photoelectric current. Hence, variation in amount of the photoelectric current is suppressed in the light receiving element region 50 of the present embodiment.

Embodiment 3

Figure 3:
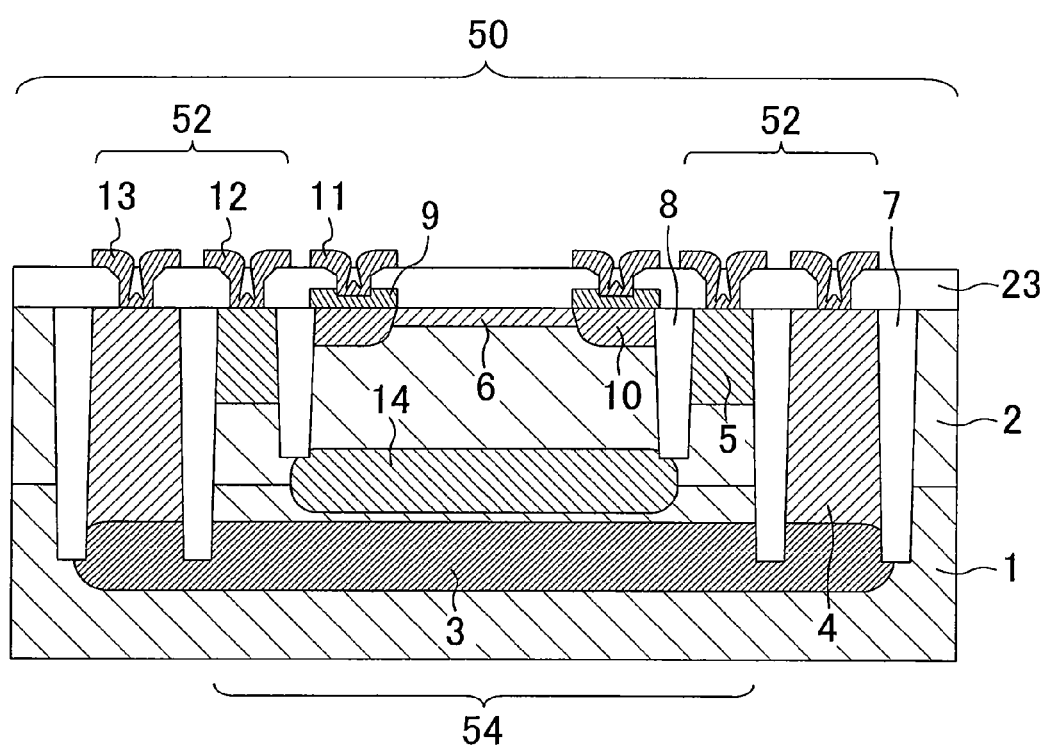
FIG. 3 is a sectional view showing a light receiving element region of a semiconductor photodetector device in accordance with Embodiment 3 of the present invention.

FIG. 3 is a sectional view showing a light receiving element region 50 of a semiconductor photodetector device in accordance with Embodiment 3 of the present invention.

Figure 5D:
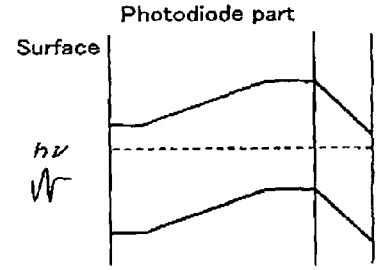
Figure 5D:
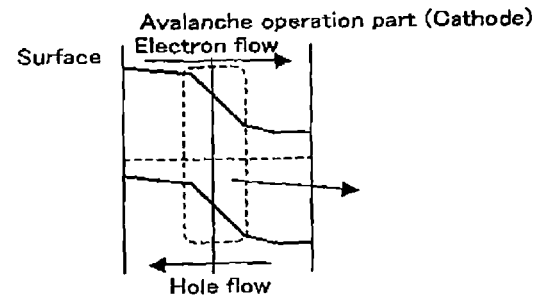
Figure 6:
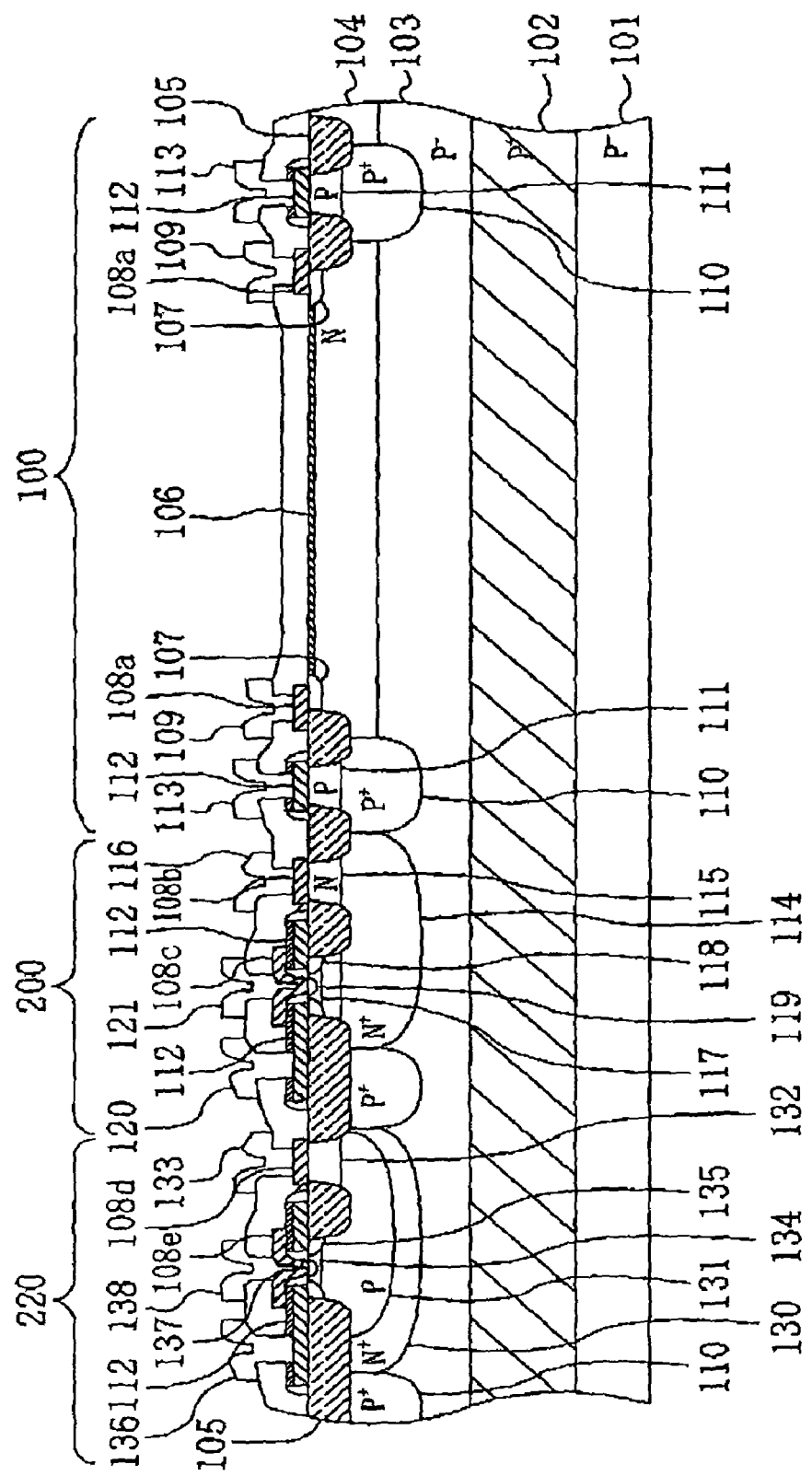
FIG. 6 is a sectional view showing a conventional semiconductor photodetector device.
Figure 7A:
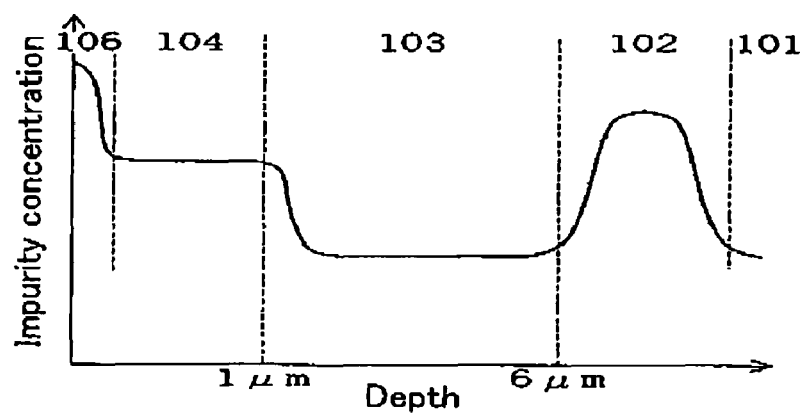
FIG. 7A is a graph showing the impurity concentration distribution in the vertical direction of the conventional semiconductor photodetector shown in FIG. 6.
Figure 7B:
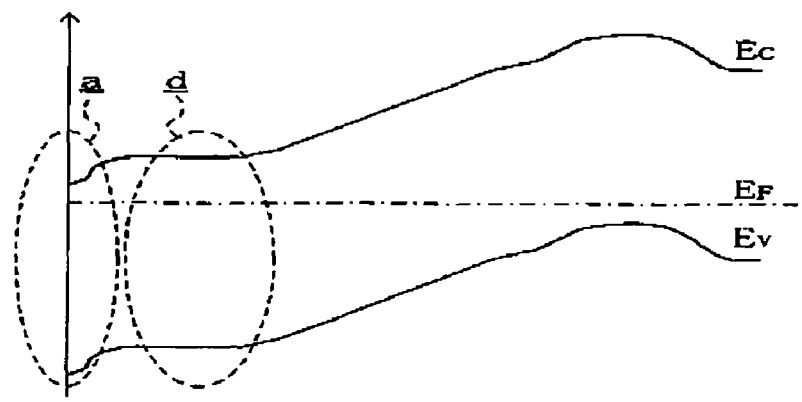
FIG. 7B is a graph showing the energy band in the vertical direction of the conventional semiconductor photodetector.

In the light receiving element region 50 of the present embodiment, the N$^+$-type semiconductor region 3 is formed not only in the current amplifying operation section 52 but also the light receiving operation section 54. With this structure in which the N$^+$-type semiconductor region 3 extends even under the P$^+$-type semiconductor region 14, junction between the light receiving operation section 54 and the P$^-$-type semiconductor substrate 1 can be separated completely to eliminate the influence of the carriers generated in the P$^-$-type semiconductor substrate 1. FIG. 5D presents graphs showing the potential distributions of the light receiving operation section 54 and the current amplifying operation section 52 of the light receiving element region 50 of the present embodiment.

It is noted that in the light receiving element region 50 in Embodiment 1 with no P$^+$-type semiconductor region 14 formed (see FIG. 1), the N$^+$-type semiconductor region 3 may have the same shape as that of the light receiving element region in the present embodiment.

Embodiment 4

FIG. 4 is a sectional view showing a semiconductor photodetector device (an OEIC device) in accordance with Embodiment 4 of the present invention. Any one of the light receiving element regions 50 described in Embodiments 1 to 3 can be integrated with a bipolar transistor, a MOS transistor, and the like on a single substrate and can be formed simultaneously with formation of the transistors. FIG. 4 shows an example using the light receiving element 50 in accordance with Embodiment 3.

On the P$^-$-type semiconductor substrate 1, there are formed, in addition to the light receiving element region 50, a first transistor region 60 in which an NPN bipolar transistor and a VPNP transistor are formed and a second transistor region 70 in which a CMOS transistor is formed. The light receiving element region 50, the first transistor region 60, and the second transistor region 70 are defined from each other by the isolation insulating layer 7 reaching the P$^-$-type semiconductor substrate 1 or the N$^+$-type semiconductor region 3.

The structure of the first transistor region 60 and the second transistor region 70 will be described below.

The first transistor region 60 includes a bipolar transistor NPN-Tr including an N-type collector part, a P-type base part, and an N-type emitter part and a bipolar transistor VPNP-Tr including a P-type collector part, an N-type base part, and a P-type emitter part.

The N-type collector part of NPN-Tr is composed of: an N-type collector region 64 formed by diffusing an N-type impurity into the P$^-$-type semiconductor layer 2; the N$^+$-type semiconductor region 3 and an N-type semiconductor region 66 serving as collector contacts; and a collector electrode 18 formed on the N-type semiconductor region 66. The P-type abase part thereof is composed of: an active base layer 15 of P-type semiconductor; a base contact region 16 of P$^+$-type semiconductor; and a base electrode 19 formed on the base contact region 16. The N-type emitter part thereof is composed of: an emitter region 17 formed on the active base layer 15 and containing an N-type impurity; a polycrystalline semiconductor layer 9b formed on the emitter region 17 and doped with an N-type impurity at a high concentration; and an N-type emitter electrode 20 formed on the polycrystalline semiconductor layer 9b.

The P-type collector part of PNP-Tr is composed of: a P$^+$-type semiconductor region 21 serving as a collector contact; a P-type semiconductor region 22 formed on the P$^+$-type semiconductor region 21 and surrounded by the isolation insulating layer 7; and a P-type collector electrode 26 formed on the P-type semiconductor region 22. The N-type base part thereof is composed of: an N-type active base region 73 formed on the N-type semiconductor region 68; an N-type contact base region 24 formed on the N-type semiconductor region 68 so as to be in contact with the N-type active base region 73; and a base electrode 28. The P-type emitter part thereof is composed of: a P-type emitter region 25 formed on the N-type active base region 73; a polycrystalline semiconductor layer 9c formed on the P-type emitter region 25; and an emitter electrode 27 formed on the polycrystalline semiconductor layer 9c.

In the light receiving element region 50 of the present invention, avalanche amplification improves the light receiving characteristics, so that transistors free from restriction of the characteristics of the light receiving element can be formed.

The second transistor region 70 includes N-channel and P-channel MOS transistors. The MOS transistors are separated from each other by the isolation insulating layer 7. Each diffusion layer is formed in the P$^-$-type semiconductor layer 2 so that an N-type source region 32, an N-type drain region 31, and an N-type polycrystalline semiconductor layer 34 serving as a gate electrode form the N-channel MOS transistor.

As well, a P-type source region 30, a P-type drain region 29, and a P-type polycrystalline semiconductor layer 33 serving as a gate electrode form the P-channel MOS transistor. The N-channel and P-channel MOS transistors include source and drain electrodes 35-38 as shown in FIG. 4.

With the use of the light receiving element region 50 of the present invention, MOS transistors free from restriction of the light sensitivity of the light receiving element region 50 can be designed.

As described above, the semiconductor photodetector device in accordance with the present embodiment enables incorporation of a light receiving element exhibiting high-speed response and high light sensitivity with respect to the three types of wavelength laser lights, NPN-Tr, VPNP-Tr, the N-channel and P-channel MOS transistors, and the like into a single chip.

The semiconductor photodetector device in accordance with the present invention can perform detection even when plural light signals having wavelengths different from one another are low outputs and is, therefore, useful for photodetection device using plural kinds of laser lights, such as DVDs.

What is claimed is:

1. A semiconductor photodetector device, comprising: a light receiving element region including:
    a light receiving operation section converting incident light to an electric signal and a current amplifying operation section amplifying the electric signal,
    wherein the light receiving operation section includes:
        a semiconductor layer of a first conductivity type formed on a first conductivity type semiconductor substrate;
        a first semiconductor region of a second conductivity type formed on the semiconductor layer;
        a second semiconductor region of the first conductivity type formed in the semiconductor layer; and
        a first isolation insulating layer separating the first semiconductor region from the second semiconductor region; and
    the current amplifying operation section amplifying the electric signal includes:
        the second semiconductor region;
        a third semiconductor region of the second conductivity type formed in the semiconductor substrate separately from the second semiconductor region;
        a fourth semiconductor region of the second conductivity type formed on the third semiconductor region; and
        a second isolation insulating layer separating the second semiconductor region from the fourth semiconductor region,
    wherein the first semiconductor region and the first isolation insulating layer are formed to be separated from each other, and
    the first isolation insulating layer has a bottom face located shallower than a bottom face of the semiconductor layer.

2. The semiconductor photodetector device of claim 1, wherein the second isolation insulating layer is in contact with the third semiconductor region.

3. The semiconductor photodetector device of claim 1, wherein the third semiconductor region extends from the current amplification operation section to the light receiving operation section.

4. The semiconductor photodetector device of claim 1, wherein the light receiving operation section further includes a fifth semiconductor region of the first conductivity type formed on the semiconductor substrate and below the semiconductor layer in a region surrounded by the first isolation insulating layer when viewed in plan.

5. The semiconductor photodetector device of claim 4, wherein the third semiconductor region extends from a part under the fourth semiconductor region to a part under the fifth semiconductor region.

6. The semiconductor photodetector device of claim 1, wherein a concentration of an impurity contained in the semiconductor layer is equal to or lower than a concentration of an impurity contained in the semiconductor substrate, and
    a concentration of an impurity contained in the first semiconductor region is higher than the concentration of the impurity contained in the semiconductor layer.

7. The semiconductor photodetector device of claim 1, wherein a concentration of an impurity contained in the third semiconductor region is higher than a concentration of an impurity contained in the semiconductor substrate, and
    a concentration of an impurity contained in the fourth semiconductor region is higher than the concentration of the impurity contained in the third semiconductor region.

8. The semiconductor photodetector device of claim 1, wherein a concentration of an impurity contained in the second semiconductor region is higher than a concentration of an impurity contained in the semiconductor substrate.

9. The semiconductor photodetector device of claim 1, wherein a concentration of an impurity contained in the third semiconductor region is higher than a concentration of an impurity contained in the semiconductor substrate.

10. The semiconductor photodetector device of claim 1, wherein the current amplifying operation section amplifies the electric signal in driving by applying voltage between the third semiconductor region and the second semiconductor region with the semiconductor layer interposed.

11. The semiconductor photodetector device of claim 10, wherein the electric signal generated in the light receiving operation section includes holes and electrons, and
    the current amplifying operation section amplifies only either the electrons and the holes of the electric signal generated in the light receiving operation section.

12. The semiconductor photodetector device of claim 1, wherein the second semiconductor region surrounds the first semiconductor region with the first isolation insulating layer interposed, and
    the fourth semiconductor region surrounds the second semiconductor region with the second isolation insulating layer interposed.

13. The semiconductor photodetector device of claim 1, further comprising:
    a first transistor region formed on the semiconductor substrate and including a bipolar transistor; and
    a second transistor region formed on the semiconductor substrate and including a MOS transistor.

14. A semiconductor photodetector device, comprising: a light receiving element region including:
    a light receiving operation section converting incident light to an electric signal; and a current amplifying operation section amplifying the electric signal,
    wherein the light receiving operation section includes:
        a semiconductor layer of a first conductivity type formed on a first conductivity type semiconductor substrate;
        a first semiconductor region of a second conductivity type formed on the semiconductor layer;
        a second semiconductor region of the first conductivity type formed in the semiconductor layer; and a first isolation insulating layer separating the first semiconductor region from the second semiconductor region; and the current amplifying operation section amplifying the electric signal includes the second semiconductor region;
  a third semiconductor region of the second conductivity type formed in the semiconductor substrate separately from the second semiconductor region;
  a fourth semiconductor region of the second conductivity type formed on the third semiconductor region; and
  a second isolation insulating layer separating the second semiconductor region from the fourth semiconductor region,
wherein the first semiconductor region and the first isolation insulating layer are funned to be separated from each other, the current amplifying operation section amplifies the electric signal in driving by applying voltage between the third semiconductor region and the second semiconductor region with the semiconductor layer interposed, the electric signal generated in the light receiving operation section includes holes and electrons, and the current amplifying operation section amplifies only either the electrons and the holes of the electric signal generated in the light receiving operation section.

15. The semiconductor photodetector device of claim 14,
wherein the second semiconductor region surrounds the first semiconductor region with the first isolation insulating layer interposed, and the fourth semiconductor region surrounds the second semiconductor region with the second isolation insulating layer interposed.

* * * * *